US011948849B2

(12) United States Patent
Jeong

(10) Patent No.: US 11,948,849 B2
(45) Date of Patent: Apr. 2, 2024

(54) PACKAGE-EMBEDDED BOARD

(71) Applicant: SAMSUNG ELECTRO-MECHANICS CO., LTD., Suwon-si (KR)

(72) Inventor: Koo Woong Jeong, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 304 days.

(21) Appl. No.: 17/199,053

(22) Filed: Mar. 11, 2021

(65) Prior Publication Data

US 2022/0208629 A1 Jun. 30, 2022

(30) Foreign Application Priority Data

Dec. 28, 2020 (KR) .......................... 10-2020-0184274

(51) Int. Cl.
*H01L 23/31* (2006.01)
*H01L 21/48* (2006.01)
(Continued)

(52) U.S. Cl.
CPC ........ *H01L 23/3121* (2013.01); *H01L 21/486* (2013.01); *H01L 21/56* (2013.01); *H01L 23/3135* (2013.01); *H01L 23/49527* (2013.01); *H01L 23/49537* (2013.01); *H01L 23/49822* (2013.01); *H01L 23/49827* (2013.01);
(Continued)

(58) Field of Classification Search
CPC ............. H01L 23/3121; H01L 23/3135; H01L 23/49527; H01L 23/49537; H01L 23/49822; H01L 23/49827; H01L 23/49861; H01L 23/5389; H01L 25/0657; H01L 25/18; H01L 23/642; H01L 23/645; H01L 2225/06524; H01L 2225/06548; H01L 2225/06582
See application file for complete search history.

(56) References Cited

U.S. PATENT DOCUMENTS 6,774,499 B1 * 8/2004 Yang ................... H01L 25/0657
257/E23.125
8,106,495 B2 * 1/2012 Kajiki .................. H01L 21/565
257/E23.18
(Continued)

FOREIGN PATENT DOCUMENTS

| JP | 5024233 B2 | 9/2012 |
| KR | 10-1426654 B1 | 8/2014 |
| KR | 10-1763019 B1 | 7/2017 |

OTHER PUBLICATIONS

Source of Fig. 2 in Employee Invention Report Form: MLF (Micro-Lead Frame) PKG.
(Continued)

*Primary Examiner* — Eugene Lee
(74) *Attorney, Agent, or Firm* — MORGAN, LEWIS & BOCKIUS LLP

(57) ABSTRACT

A package-embedded board includes: a core layer having a through-hole portion; a package at least partially disposed in the through-hole portion and including a die pad, an electronic component disposed on the die pad, and a molded portion covering the electronic component; and a core insulating material disposed in the through-hole portion and covering the core layer and the package.

20 Claims, 14 Drawing Sheets

(51) Int. Cl.
*H01L 21/56* (2006.01)
*H01L 23/495* (2006.01)
*H01L 23/498* (2006.01)
*H01L 23/538* (2006.01)
*H01L 25/00* (2006.01)
*H01L 25/065* (2023.01)
*H01L 25/18* (2023.01)
*H01L 23/64* (2006.01)

(52) U.S. Cl.
CPC .... *H01L 23/49861* (2013.01); *H01L 23/5389* (2013.01); *H01L 25/0657* (2013.01); *H01L 25/18* (2013.01); *H01L 25/50* (2013.01); *H01L 23/642* (2013.01); *H01L 23/645* (2013.01); *H01L 2225/06517* (2013.01); *H01L 2225/06524* (2013.01); *H01L 2225/06548* (2013.01); *H01L 2225/06582* (2013.01)

(56) References Cited

U.S. PATENT DOCUMENTS

| | | | | |
|---|---|---|---|---|
| 9,307,632 | B2* | 4/2016 | Lee | H05K 1/0271 |
| 10,050,016 | B2* | 8/2018 | Lee | H01L 24/20 |
| 10,249,601 | B2* | 4/2019 | Kim | H01L 23/5386 |
| 10,347,598 | B2* | 7/2019 | Baek | H01L 23/49822 |
| 10,573,608 | B2* | 2/2020 | Dogiamis | H01L 23/552 |
| 10,903,169 | B2* | 1/2021 | Huang | H01L 21/4857 |
| 2011/0024899 | A1* | 2/2011 | Masumoto | H01L 23/49816 257/E21.705 |
| 2014/0185264 | A1* | 7/2014 | Chen | H01L 23/3128 361/814 |
| 2014/0360765 | A1* | 12/2014 | Kiwanami | H05K 1/185 174/260 |
| 2015/0179570 | A1* | 6/2015 | Marimuthu | H01L 24/97 438/126 |
| 2016/0013076 | A1* | 1/2016 | Vincent | H01L 24/20 257/777 |
| 2016/0021754 | A1 | 1/2016 | Chen et al. | |
| 2016/0276307 | A1* | 9/2016 | Lin | H01L 23/562 |
| 2017/0103951 | A1* | 4/2017 | Lee | H01L 21/4857 |
| 2017/0287853 | A1* | 10/2017 | Kim | H01L 23/3128 |
| 2019/0115287 | A1* | 4/2019 | Derai | H01L 24/73 |
| 2019/0139853 | A1* | 5/2019 | Oh | H01L 23/562 |
| 2019/0279937 | A1* | 9/2019 | Chiu | H01L 21/486 |
| 2020/0020653 | A1* | 1/2020 | Lim | H01Q 1/243 |
| 2020/0051918 | A1* | 2/2020 | Bae | H01L 23/5389 |

OTHER PUBLICATIONS

Source of Fig. 3 in Employee Invention Report Form: DNP claims world's thinnest chip package (https://www.electronicsweekly.com/news/products/micros/dnp-claims-worlds-thinnest-chip-package-2009-03/).

Source of Fig. 3 in Employee Invention Report Form: Product specification_QFN_ASE KOREA (https://www.asekr.com/asekr_new/Products/ProductsContents/?item=7_1).

* cited by examiner

US 11,948,849 B2

PACKAGE-EMBEDDED BOARD

CROSS-REFERENCE TO RELATED APPLICATION(S)

This application claims benefit of priority to Korean Patent Application No. 10-2020-0184274 filed on Dec. 28, 2020 in the Korean Intellectual Property Office, the disclosure of which is incorporated herein by reference in its entirety.

TECHNICAL FIELD

The present disclosure relates to a package-embedded board.

BACKGROUND

With the continued development of information technologies (IT) such as mobile communications technology, semiconductor technology, and network technology, there has been an increasing demand for an IT-convergence product in which one terminal has various functions such as a wireless communications function, a data communications function, a multimedia function, and a game function. In particular, as a ubiquitous online society in which access to the Internet is possible anytime and everywhere, in all aspects of daily life arrives, it is expected that the IT-convergence product will soon be established as a necessity, indispensable in daily life. Such an IT-convergence product necessarily requires a system-on-chip technology in which multiple components having various functions are integrated as a single semiconductor. A system-in-package (SiP) has emerged as a promising alternative for compensating for various problems (time, costs, productivity, accommodation, heterogeneous integration, and the like). Unlike existing SoC technology, in the case of using a SiP, different technologies may be implemented on a single package.

SUMMARY

An aspect of the present disclosure may provide a package-embedded board, advantageous in miniaturization and thickness reduction.

Another aspect of the present disclosure may provide a package-embedded board improving a degree of integration.

Another aspect of the present disclosure may provide a package-embedded board improving a space utilization level of a board in a system-in-package (SiP) package.

According to an aspect of the present disclosure, a package-embedded board may include a core layer having a through-hole portion; an electronic component package disposed in the through-hole portion; a core insulating material disposed in the through-hole portion and covering the core layer and the electronic component package; and first and second wiring layers disposed on one surface and the other surface of the core insulating material, respectively.

According to another aspect of the present disclosure, a package-embedded board may include: first and second core layers having first and second through-hole portions, respectively; first and second packages disposed in the first and second through-hole portions, respectively; and a first core insulating material disposed in each of the first and second through-hole portions and covering each of the first and second packages.

According to another aspect of the present disclosure, a package-embedded board may include: a first package including a die pad, a first electronic component disposed on the die pad, a plurality of leads spaced apart from edges of the die pad and connected to the first electronic component, and a first molded portion covering the first electronic component and the plurality of leads; an insulating material covering the first package; first and second wiring layers respectively disposed on opposing surfaces of the insulating material; and first wiring vias disposed in the insulating material and connecting the first wiring layer to the plurality of first leads.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
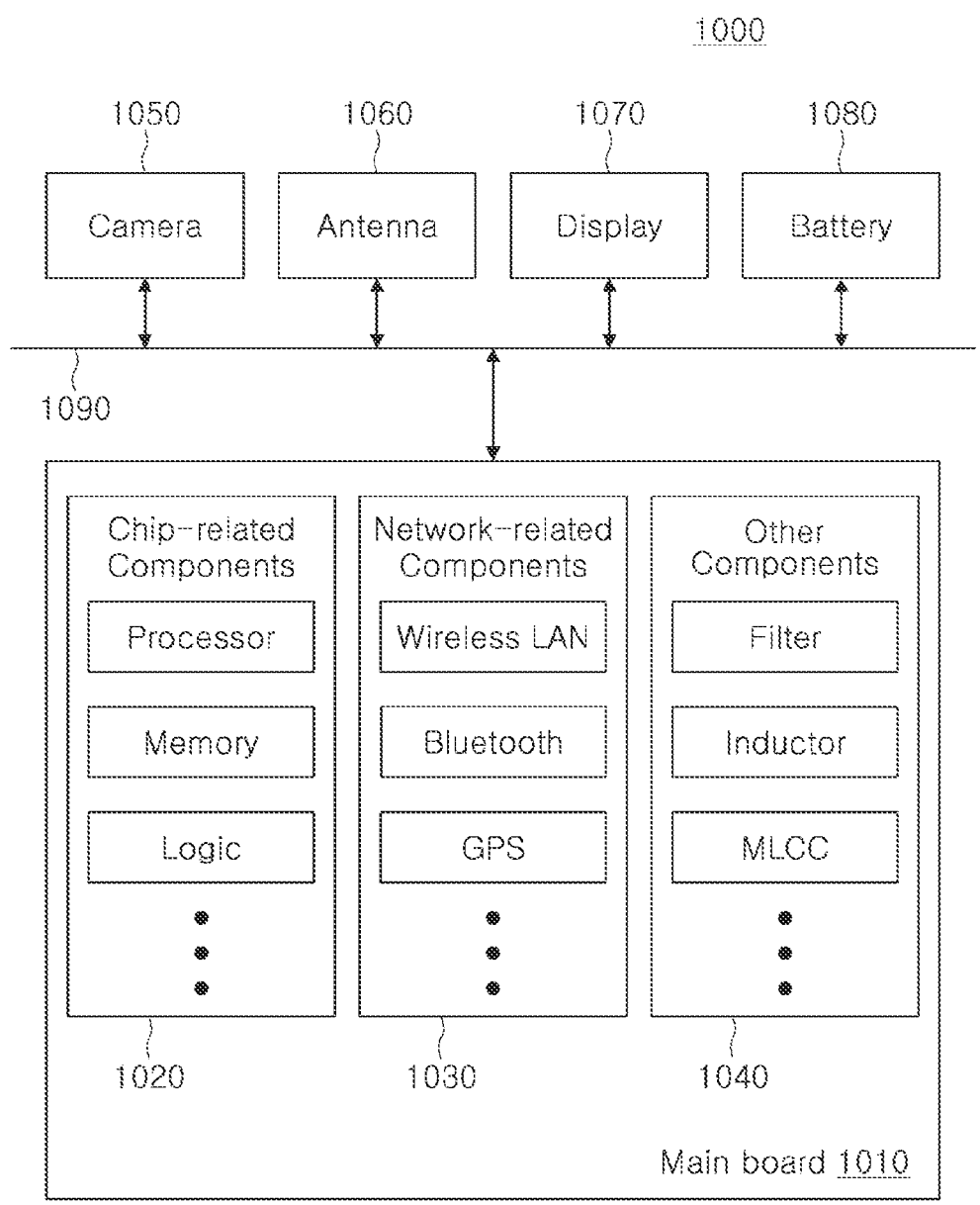
FIG. 1 is a block diagram schematically illustrating an example of an electronic device system.

FIG. 1 is a block diagram schematically illustrating an example of an electronic device system.

Referring to FIG. 1, an electronic device 1000 may accommodate a main board 1010 therein. The main board 1010 may include chip-related components 1020, network-related components 1030, other components 1040, and the like, physically or electrically connected thereto. These components may be connected to others to be described later to form various signal lines 1090.

The chip-related components 1020 may include a memory chip such as a volatile memory (for example, a dynamic random access memory (DRAM)), a non-volatile memory (for example, a read only memory (ROM)), or a flash memory; an application processor chip such as a central processor (for example, a central processing unit (CPU)), a graphics processor (for example, a graphics processing unit (GPU)), a digital signal processor, a cryptographic processor, a microprocessor, or a microcontroller; and a logic chip such as an analog-to-digital (ADC) converter or an application-specific integrated circuit (ASIC). However, the chip-related components 1020 are not limited thereto, but may also include other types of chip-related components. Further, these chip-related components may be combined with each other. The chip-related components 1020 may be in a form of a package including the above-described chips.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network-related components 1030 are not limited thereto, but may also include a variety of other wireless or wired standards or protocols. In addition, the network-related components 1030 may be combined with the chip-related components 1020 and provided in a form of a package.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive elements in a form of a chip component used for various other purposes, or the like. In addition, other components 1040 may be combined with the chip-related components 1020 and/or network-related components 1030 and provided in a form of a package.

Depending on a type of the electronic device 1000, the electronic device 1000 may include other components that may or may not be physically or electrically connected to the main board 1010. Examples of other components include a camera module 1050, an antenna module 1060, a display 1070, and a battery 1080. However, other components are not limited thereto, but may include an audio codec, a video codec, a power amplifier, a compass, an accelerometer, a gyroscope, a speaker, a mass storage device (for example, a hard disk drive), a compact disk (CD), a digital versatile disk (DVD), and the like. In addition, the electronic device 1000 may include other components used for various purposes depending on the type of the electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
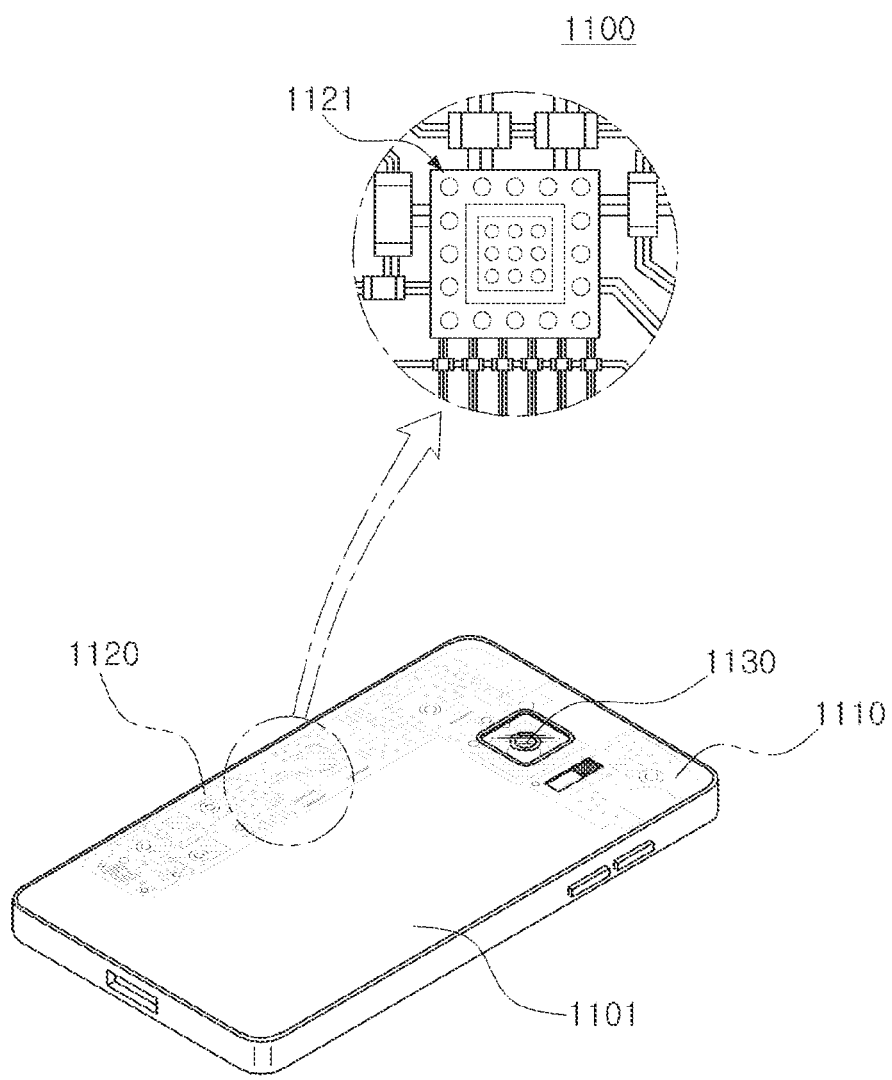
FIG. 2 is a perspective view schematically illustrating an example of an electronic device.

FIG. 2 is a perspective view schematically illustrating an example of the electronic device.

Referring to FIG. 2, the electronic device may be, for example, a smartphone 1000. A motherboard 1100 is accommodated in the smartphone 1000, and various electronic components 1120 are physically and/or electrically connected to the motherboard 1100. Further, a camera module 1130, a speaker, and/or the like are accommodated in the smartphone 1000. Some of the electronic components 1120 may be the above-described chip-related components such as a package-embedded board 1121, but are not limited thereto. The package-embedded board 1121 may have a form in which an electronic component is embedded in a multilayer printed circuit board, but is not limited thereto. Meanwhile, the electronic device is not necessarily limited to the smartphone 1000, but may be other electronic devices as described above.

Figure 3:
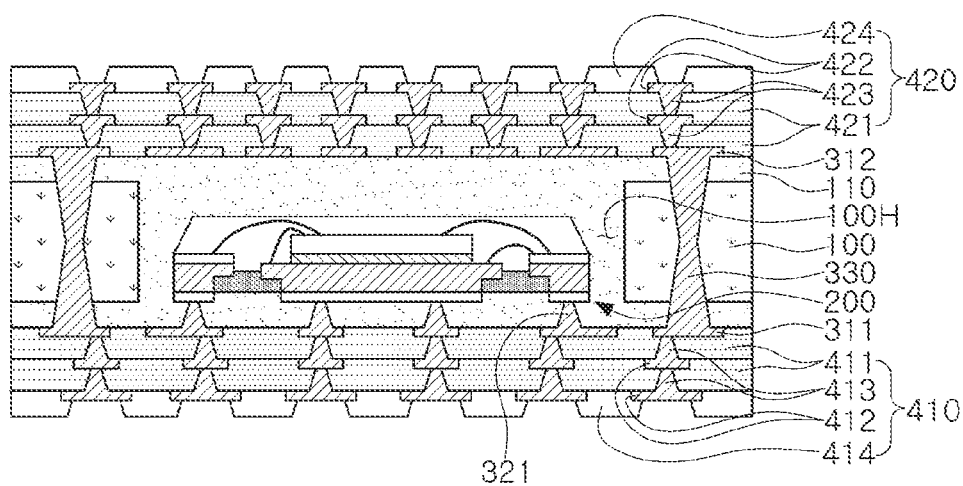
FIG. 3 is a cross-sectional view schematically illustrating an example of a package-embedded board.

FIG. 3 is a cross-sectional view schematically illustrating an example of a package-embedded board.

Referring to FIG. 3, a package-embedded board 700A1 according to an example may include: a core layer 100 having a through-hole portion 100H; a package 200 disposed in the through hole portion 100H of the core layer 100; a core insulating material 110 disposed on the core layer 110 and filling the through-hole portion 100H to cover the package 200; first and second wiring layers 311 and 312 disposed on one surface and the other surface of the core insulating material 110, respectively; first wiring vias 321 penetrating through at least a portion of the core insulating material 110 and electrically connecting the first wiring layer 311 and the package 200 to each other; a through via 330 penetrating through at least a portion of each of the core insulating material 110 and the core layer 100 and electrically connecting the first and second wiring layers 311 and 312 to each other; and first and second build-up structures 410 and 420 disposed on one surface and the other surface of the core insulating material 110, respectively.

For example, in the package-embedded board 700A1 according to an example, the package 200 may be disposed in the through-hole portion 100H of the core layer 100. The package 200 (elements thereof are labeled in FIG. 5) may be, for example, a lead-frame package in which an electronic component 240 is molded. A lead frame refers to a material that serves as a lead connecting an input/output pad of an electronic component and an electric circuit formed on a main board to each other, and serves as a frame fixing a semiconductor package to the main board at the same time. The lead-frame package refers to a package molded using a molding material or the like, in which a terminal for transmitting a signal to a main board is formed using the above-described lead frame to protect an electronic component in which various electronic circuits and wirings are formed from various external environments, and to optimize and maximize the performance of the electronic component. As the package 200 is disposed in the through-hole portion 100H, an overall thickness of the package-embedded board 700A1 may be reduced to enable miniaturization and thickness reduction of components. As a result, an overall size of the package-embedded board 700A1 may be reduced.

Hereinafter, each component of the package-embedded board 700A1 according to an example will be described in more detail.

For example, the package-embedded board 700A1 according to an example includes the core layer 100 having the through-hole portion 100H. The core layer 100 may improve rigidity of the package-embedded board 700A1 depending on specific material, and may serve to ensure thickness uniformity of the core insulating material 110 to be described later.

In the core layer 100, the through-hole portion 100H penetrating through the entire core layer 100 may be formed as a result of performing a process to be described later. The core layer 100 may function as a core of the package-embedded board 700A1, and may also function as a core layer serving as a base in a build-up process even in a process for manufacturing the package-embedded board 700A1. The through-hole portion 100H may be a space whose four sides are all closed. However, the four sides may have a discontinuous portion, for example, a portion open to the outside, in a partial region, if needed. The number of through-hole portions 100H may be plural, if needed. In addition, the same or different packages 200 may be disposed in the through-hole portions 100H, respectively. A thickness of the core layer 100 may be larger than a thickness of each of a plurality of insulating build-up layers 411 and 421 to be described later. The thickness of the core layer 100 may be larger than a thickness of the package 200.

The core layer 100 may be formed of an insulating material, and the insulating material may be a thermosetting resin such as an epoxy resin or a thermoplastic resin such a polyimide resin. Further, the insulating material may be a material in which an inorganic filler such as silica and a reinforcement material such as a glass fiber are contained in the thermosetting resin or the thermoplastic resin. For example, a prepreg may be used, but the insulating material is not limited thereto.

The package 200 (elements thereof are labeled in FIG. 5) may have the electronic component 240 packaged therein and disposed, and thus, may also be referred to as an electronic component package. The package 200 includes a die pad 220, the electronic component 240 disposed on the die pad 220, and a plurality of leads 210 spaced apart from edges of the die pad 220. The plurality of leads 210 and the die pad 220 may serve as a frame supporting the package, and at the same time, may electrically connect (lead) the electronic component 240 in the package to an external component. Accordingly, the package 200 may be the lead-frame package.

Each of the plurality of leads 210 and the die pad 220 may be formed by etching the same metal substrate while using an etching resist. For example, an etching resist such as a photosensitive resist is arranged on a metal substrate, except for a region in which gaps between the plurality of leads 210 and the die pad 220 are to be formed, and the metal substrate is subjected to exposure/development, and etching to form the gaps between the plurality of leads 210 and the die pad 220. An insulating portion 230 may be disposed in the gap, such that the plurality of leads 210 and the die pad 220 may be insulated from each other and spaced apart from each other.

The die pad 220 is a means on which the electronic component 240 is seated and supported. The die pad 220 may contain a metal material, and may have a thickness the same as or similar to that of the plurality of leads 210. Further, the die pad 220 may function as a ground. A material of the die pad 220 may be a metal material, and the metal material may be copper (Cu), aluminum (Al), silver (Ag), tin (Sn), gold (Au), nickel (Ni), lead (Pb), titanium (Ti), or alloys thereof.

Meanwhile, a surface plating layer may be formed on one surface of the die pad 220, and may contain the same conductive metal material as that of a plating layer formed on a surface of the lead 210 to be described later. The surface plating layer may contain a metal material for protection of a surface of a metal used to form the die pad 220 and electrical connection with other components. The metal material may be any one of metal materials used as the material of the die pad, or alloys thereof.

The plurality of leads 210 may be disposed so as to surround the die pad 220 while being spaced apart from the die pad 220 by a predetermined distance. As described above, the plurality of leads 210 may be formed at the same time as the die pad 220 by etching a metal substrate, and thus, may have a thickness the same as or similar to that of the die pad 220. The plurality of leads 210 may have a lead-frame package structure including a terminal portion having a flat plate shape, and an extension portion protruding from one side of the terminal portion, or may have a micro lead-frame package structure that only has a flat plate shape, as in the present disclosure. The present disclosure will be described taking the case that the above-described micro lead-frame package structure is applied as an example.

Meanwhile, the plurality of leads 210 may be electrically connected to terminals of the electronic component seated on the die pad 220 described above. As the leads 210 electrically connected to the terminals of the electronic component 240 are connected to the wiring layer of the package-embedded board, or the like, the electronic component 240 may be electrically connected to the wiring layer of the package-embedded board or the like.

The plurality of leads 210 and the terminals of the electronic component 240 may be connected using a conductive wire 250 as illustrated in FIG. 3, or may be connected by a flip-chip method. The flip-chip method refers to a method in which, when attaching an electronic component to a circuit board, the electronic component is fused as is using an electrode pattern on a bottom surface of a chip without using an additional connection structure such as a conductive wire or an intermediate medium such as a ball grid array.

The plurality of leads 210 may have a thickness the same as or similar to that of the die pad 220. A material of the plurality of leads 210 may be a metal material, and the metal material may be copper (Cu), aluminum (Al), silver (Ag), tin (Sn), gold (Au), nickel (Ni), lead (Pb), titanium (Ti), or alloys thereof.

Meanwhile, first and second conductive layers 211 and 212 may be disposed on one surface and the other surface of each of the plurality of leads 210, respectively. The first and second conductive layers 211 and 212 may function as surface treatment layers for preventing surface oxidation, and may contain a conductive metal material to enable electrical connections between the leads 210 and other components. The first conductive layer 211 may contain, for example, silver (Ag), and the second conductive layer 212 may contain, for example, tin (Sn), but the materials of the first and second conductive layers 211 and 212 are not limited thereto. That is, the first and second conductive layers 211 and 212 may contain any one of the metal materials contained in the leads 210 or an alloy thereof without limitation, as long as is a conductive metal material.

The electronic component 240 may be mounted on the die pad 220 using an adhesive layer T1. The electronic component 240 may be an integrated circuit (IC) in which several hundreds to several millions of elements or more are integrated in a single chip. The electronic component 240 may be, for example, a processor chip (more specifically, an application processor (AP)) such as a central processor (for example, a CPU), a graphic processor (for example, a GPU), a field programmable gate array (FPGA), a digital signal processor, a cryptographic processor, a microprocessor, a microcontroller, or the like, but is not limited thereto. In addition, the electronic component 240 may be a memory such as a volatile memory (for example, a DRAM), a non-volatile memory (for example, a ROM), a flash memory, or the like, or a logic such as an analog-to-digital converter, an application-specific IC (ASIC), or the like. Meanwhile, the electronic component 240 is not limited to the above-described element or die, and may be a general electronic element, semiconductor element, or semiconductor chip. Although not illustrated, a terminal may be formed on a surface of the electronic component 240 and electrically connected to the conductive wire 250 to be described later, and in a case in which the electronic component 240 is mounted by the flip-chip method, the terminal may be directly connected to the die pad 220 or lead 210, or may be electrically connected through a solder. The terminal of the electronic component 240 may contain a metal material such as copper (Cu) or aluminum (Al).

The insulating portion 230 may be disposed between the die pad 220 and the lead 210, and may be exposed through an opening formed between the die pad 220 and the lead 210. The insulating portion 230 may contain a general insulating material, and the insulating portion 230 and the opening serves to divide and insulate the die pad 220 and the lead 210 from each other. That is, the die pad 220 and the lead 210 may be divided from each other through the insulating portion 230 having a thickness smaller than that of the die pad 220. The opening may be filled with a molding material of a molded portion 260 to be described later. The die pad 220 and the lead 210 may each have a thickness larger than that of the insulating portion 230.

The conductive wire 250 is a component electrically connecting the electronic component 240 and the lead 210, and the electronic component 240 and the lead 210 may be connected by a wiring method. Further, the conductive wire 250 may electrically connect the electronic component 240 and the die pad 220, and electrically connect the lead 210 and the die pad 220. In this case, the die pad 220 may serve as a ground in the package 200. Meanwhile, in a case of using the package using the flip-chip method, since the terminal of the electronic component 240 may be directly connected to the lead 210 or the die pad 220 by soldering or the like, the conductive wire 250 may be omitted.

The molded portion 260 may be disposed on the die pad 220 and the lead 210 so as to cover the electronic component 240, and may be formed of a general molding material. For example, the molded portion 260 may contain an epoxy molding compound (EMC), and may fill the opening on the insulating portion 230.

The core insulating material 110 may be disposed on one surface and the other surface of the core layer 100, and fill at least a portion of the through-hole portion 100H formed in the core layer 100. Further, the core insulating material 110 may cover the package 200 disposed in the through-hole portion 100H. For example, the core insulating material 110 may be in physical contact with at least a portion of each of an upper surface, a lower surface, and side surfaces of the package 200. Further, the core insulating material 110 may be in contact with an inner wall of the through-hole portion 100H. Therefore, the core insulating material 110 serves to insulating the package 200 from other components, except for a conductive component penetrating through the core insulating material 110. The core insulating material 110 may be formed of an insulating material having fluidity in a high-temperature environment, and thus, may flow into a surplus space in the through-hole portion 100H, thereby filling an empty space of the through-hole portion 100H. In this case, the package 200 may be embedded in the core insulating material 110 and fixed in the through-hole portion 100H without a separate adhesive film and a separate metal pattern for stopper, which may be advantageous in miniaturization and thickness reduction of the package-embedded board 700A1. In addition, the entire thickness may be reduced to make a central axis between an upper portion and a lower portion of the board closer to the package 200, and increase a percentage of the area of the package 200 in the board, which may be advantageous in warpage reduction.

The core insulating material 110 may be formed of any insulating material having fluidity at a high temperature, without limitation, and the insulating material for the core insulating material 110 may be a thermosetting resin such as an epoxy resin, or a thermoplastic resin such as a polyimide resin. Further, the insulating material may be a material in which an inorganic filler such as silica is contained in the thermosetting resin or the thermoplastic resin. For example, the core insulating material 110 may be formed of an Ajinomoto build-up film (ABF). The ABF may be provided in a resin coated copper (RCC) form, but is not limited thereto. A photosensitive material such as a photoimageable dielectric (PID) material may also be used as needed.

The first and second wiring layers 311 and 312 may be disposed on one surface and the other surface of the core insulating material 110, respectively. The first and second wiring layers 311 and 312 may be formed of a metal material such as copper (Cu), aluminum (Al), silver (Ag), tin (Sn), gold (Au), nickel (Ni), lead (Pb), titanium (Ti), or alloys thereof. The second wiring layer 132 may perform various functions, depending on design. For example, the second wiring layer 132 may include a ground pattern, a power pattern, a signal pattern, and the like. Each of the patterns may have a line form, a plane form, or a pad form. The second wiring layer 132 may be formed by plating such as an additive process (AP), a semi AP (SAP), modified SAP (MSAP), or tenting (TT). As a result, the second wiring layer 132 may include a seed layer, an electroless plating layer, and an electroplating layer formed on the basis of the seed layer. In a case in which the core insulating material 110 has the RCC form, the first and second wiring layers 311 and 312 may each include a metal foil such as a copper foil. In addition, a primer resin may be provided on a surface of the metal foil as needed.

At least a portion of the first wiring vias 321 may penetrate through at least a portion of the core insulating material 110, and electrically connect the first wiring layer 311 and at least a portion of the plurality of leads 210. Further, at least the other some of the first wiring vias 321 may penetrate through at least a portion of the core insulating material 110, and electrically connect the first wiring layer 311 and the die pad 220.

A plurality of first wiring vias 321 may be formed after the package 200 is embedded in the core insulating material 110 according to a process to be described later. Therefore, at least a portion of the plurality of first wiring vias 321 may have a tapered shape whose width is decreased from the first wiring layer 321 toward the lead 210, or at least the other some of the plurality of first wiring vias 321 may have a tapered shape whose width is decreased from the first wiring layer 321 toward the die pad 220.

The first wiring via 321 may be formed of a metal material such as copper (Cu), aluminum (Al), silver (Ag), tin (Sn), gold (Au), nickel (Ni), lead (Pb), titanium (Ti), or alloys thereof. The first wiring via 321 may be a via for a signal, a via for a ground, a via for power, or the like, depending on designs. The first wiring via 321 may be formed by completely filling a via hole with a metal material. Alternatively, a metal material may be formed along a wall of the via hole. The first wiring via 321 may also be formed by plating such as AP, SAP, MSAP, or TT. As a result, the first wiring via 321 may include a seed layer, an electroless plating layer, and an electroplating layer formed on the basis of the seed layer. The number of first wiring vias 321 may be plural, and each of the first wiring vias 321 may have a tapered shape, one surface of which having a width wider than that of the other surface.

The through via 330 may penetrate through at least a portion of each of the core layer 100 and the core insulating material 110, and electrically connect the first and second wiring layers 311 and 312 to each other. The through via 330 may be formed of a metal material such as copper (Cu), aluminum (Al), silver (Ag), tin (Sn), gold (Au), nickel (Ni), lead (Pb), titanium (Ti), or alloys thereof. The through via 330 may be a via for a signal, a via for a ground, a via for power, or the like, depending on designs. The through via 330 may be formed by completely filling a via hole with a metal material. Alternatively, a metal material may be formed along a wall of the via hole. The through via 330 may also be formed by plating such as AP, SAP, MSAP, or TT. As a result, the through via 330 may include a seed layer, an electroless plating layer, and an electroplating layer formed on the basis of the seed layer. The through via 330 may be formed by performing double-side machining on the core layer 100 and the core insulating material 110 and have an hourglass shape or a shape whose width varies in a stacking direction.

The first and second build-up structures 410 and 420 may provide various wiring paths for the package-embedded board 700A1. The first and second build-up structures 410 and 420 may be disposed on one surface and the other surface of the core insulating material 110, respectively. The first build-up structure 410 may include the plurality of insulating build-up layers 411, a plurality of wiring layers 412, a plurality of via layers 413, and a solder resist layer 414, and the second build-up structure 420 may include the plurality of insulating build-up layers 421, a plurality of wiring layers 422, a plurality of via layers 423, and a solder resist layer 424. In addition, the first and second insulating build-up layers 411 and 421 formed on the innermost sides of the first and second build-up structures 410 and 420, respectively, may be disposed so as to cover the first and second wiring layers 311 and 312, respectively.

The number of plurality of insulating build-up layers 411 and 421, the number of plurality of wiring layers 412 and 422, and the number of plurality of via layers 413 and 423 may each be larger or smaller than those illustrated in FIG. 3.

Meanwhile, the first solder resist layer 414 may be disposed on the outermost of the first insulating build-up layers 411, and the second solder resist layer 424 may be disposed on the outermost of the second insulating build-up layers 421. The first solder resist layer 414 having a plurality of first openings may expose at least a portion of the outermost of the plurality of first wiring build-up layers 412, and the second solder resist layer 424 having a plurality of second openings may expose at least a portion of the outermost of the plurality of second wiring build-up layers 422. The first and second solder resist layers 414 and 424 may protect internal components from physical or chemical damage. The first and second solder resist layers 414 and 424 may be formed of an insulating material, and the insulating material may be a thermosetting resin such as an epoxy resin, a thermoplastic resin such as a polyimide resin, or a material in which the thermosetting resin or the thermoplastic resin is mixed with an inorganic filler, for example, an Ajinomoto build-up film (ABF), but is not limited thereto.

Meanwhile, the package-embedded board 700A1 according to an example may be manufactured by stacking the first and second build-up structures 410 and 420 on opposite surfaces of a stacked body in which the package 200 is fixed to the core insulating material 110 in the through-hole portion 100H of the core layer 100 by heating or the like, respectively, in a lump as in the process to be described later.

FIGS. 4 through 11 are cross-sectional views schematically illustrating an example of a process for manufacturing the package-embedded board of FIG. 3.

Figure 4:
FIGS. 4 through 11 are cross-sectional views schematically illustrating an example of a process for manufacturing the package-embedded board of FIG. 3.

Referring to FIG. 4, a carrier 10 onto which an adhesive 11 is applied is first prepared. The carrier 10 may be a detach carrier film, and may also be a copper clad laminate (CCL) as needed. The adhesive 11 and the carrier 10 may include a release layer so that the adhesive 11 and the carrier 10 may be separated from a precursor of the package-embedded board 700A1 later.

Figure 5:
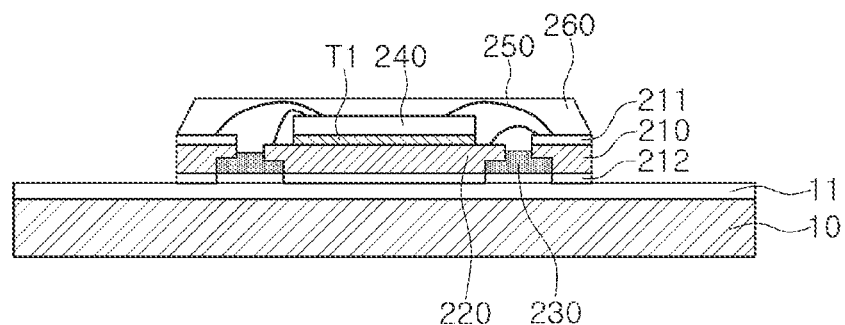
Figure 6:
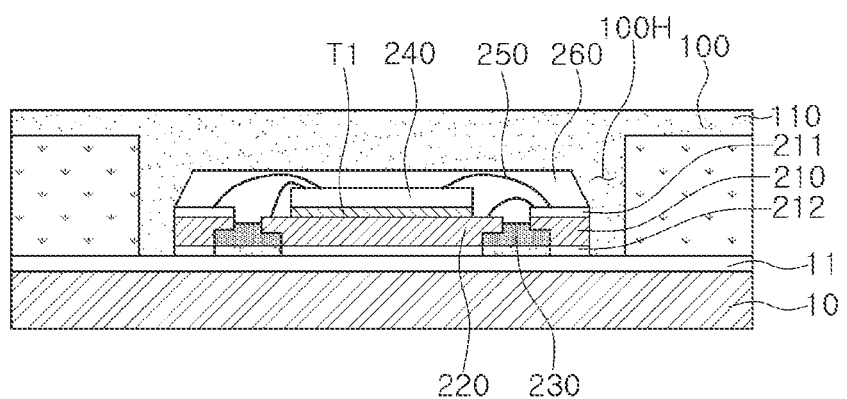
Figure 7:
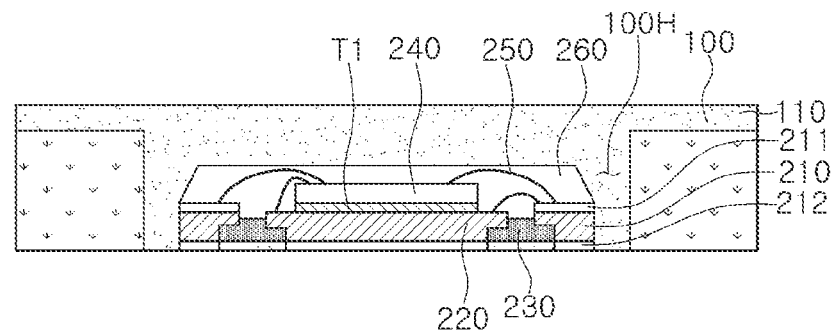

As illustrated in FIGS. 5 and 6, the package 200 is attached to the carrier 10 using the adhesive 11 on the carrier 10, and the core layer 100 in which the through-hole portion 100H is formed is stacked. Here, the core layer 100 is stacked so that the package 200 is disposed in the through-hole portion 100H, and then the core insulating material 110 is heated and compressed to fill at least a portion of the through-hole portion 100H while covering the core layer 100 and the package 200. Then, as illustrated in FIG. 7, the adhesive 11 and the carrier 10 are separated from the package 200 and the core layer 100.

Figure 8:
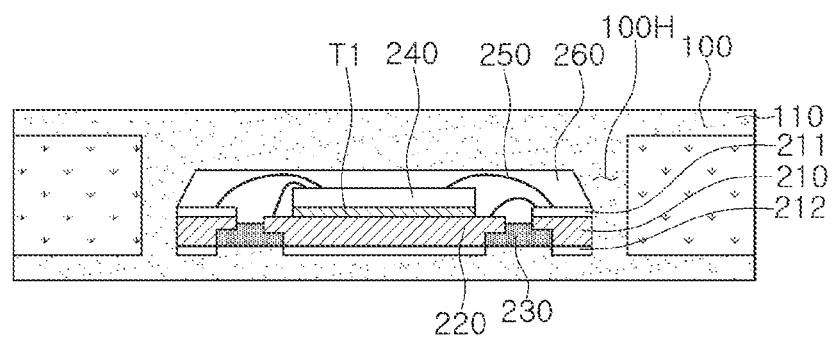

Next, as illustrated in FIG. 8, an insulating material is heated and stacked on lower sides of the core layer 100 and the package 200, such that the core insulating material 110 is in physical contact with at least a portion of each of an upper surface, a lower surface, and side surfaces of the package 200 while covering the package 200. If necessary, in the stacking process, heating may be additionally performed to increase fluidity of the core insulating material 110. After the stacking, the unhardened or semi-hardened materials may be hardened by heating or the like.

Figure 9:
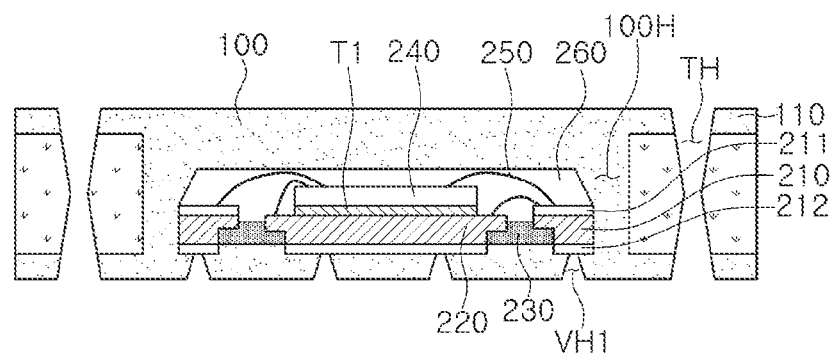

Referring to FIG. 9, a through via hole TH and a first wiring via hole VH1 are formed, the through via hole TH penetrating through at least a portion of each of the core insulating material 110 and the core layer 100, and the first wiring via hole VH1 penetrating through at least a portion of the core insulating material 110 and exposing at least a portion of the die pad 220 of the package 200 and/or the lead 210. The through via hole TH and the first wiring via hole VH1 may each be formed by a general via hole forming method such as laser machining or mechanical drilling. Meanwhile, the through via hole TH and the first wiring via hole VH1 may also be formed by exposure/development using a dry film resist, and in this case, the through via hole TH and the first wiring via hole VH1 may each have a relatively more uniform width in a stacking direction, as compared with a case of using laser machining.

Meanwhile, the through via hole TH penetrates through parts of the thick core layer 100 and core insulating material 110, and thus may be formed by double-side machining. Therefore, the through via hole TH may have an hourglass shape or a shape whose width is decreased from an outer portion toward an inner portion as illustrated in FIG. 9. The first wiring via hole VH1 may have a tapered shape whose width is decreased from one surface of the core insulating material 110 toward the package 200.

Figure 10:
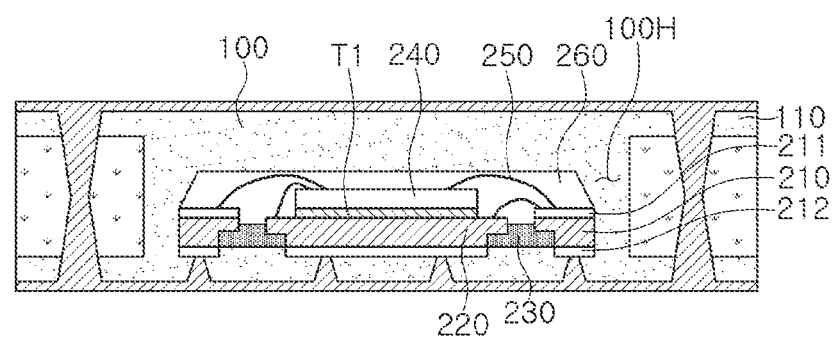
Figure 11:
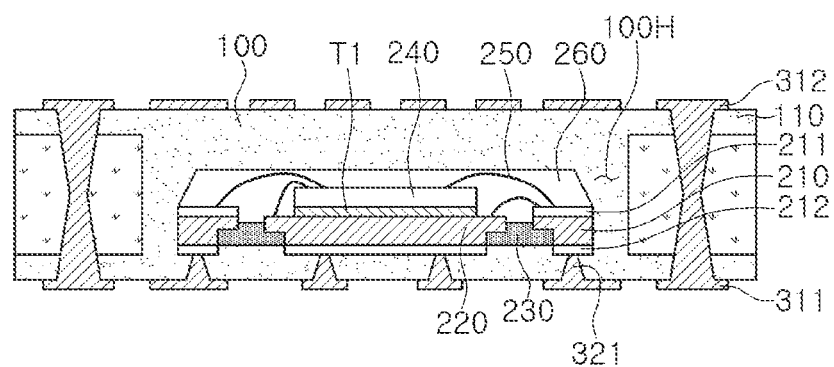

Referring to FIGS. 10 and 11, the through via 330 and the first wiring via 321 may be formed by filling the through via hole TH and the first wiring via hole VH1 through plating or by performing plating on inner walls of the through via hole TH and the first wiring via hole VH1. Further, plating layers may be formed on one surface and the other surface of the core insulating material 110, respectively, and the first and second wiring layers 311 and 312 may be formed by patterning the plating layers, respectively.

Solder resist layers having openings that expose at least portions of the first and second wiring layers 311 and 312 may be disposed on opposite surfaces of the board in which the package 200 of FIG. 11 is embedded, respectively, thereby enabling connection with external components and protecting the first and second wiring layers 311 and 312 from an external physical or chemical damage.

Further, in order to provide various wiring paths, the first and second insulating build-up layers 411 and 421 may be disposed on one surface and the other surface of the core insulating material 110, respectively, as in the package-embedded board 700A1 according to an example illustrated in FIG. 3.

Figure 12:
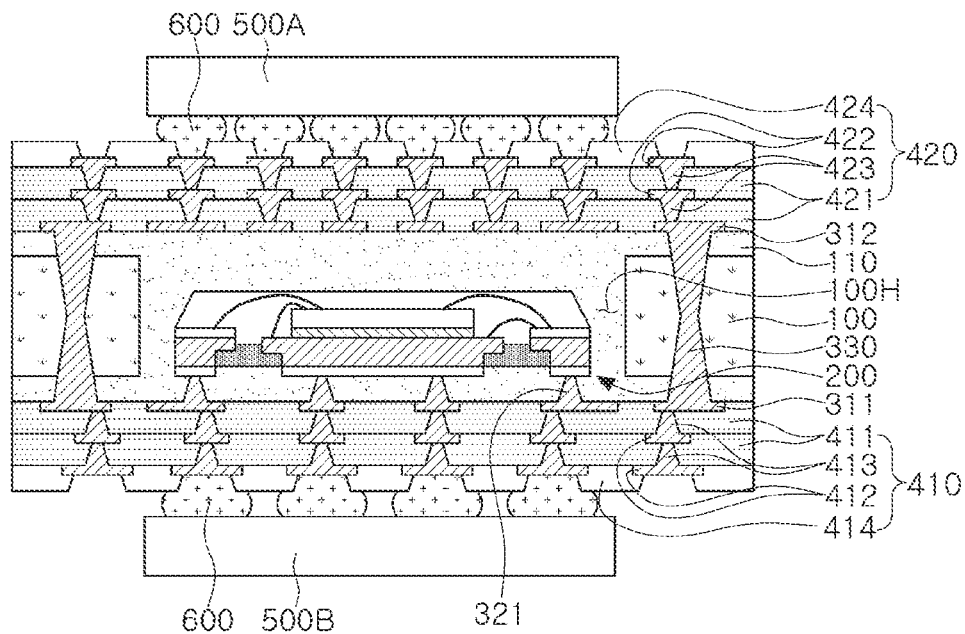
FIG. 12 is a cross-sectional view schematically illustrating another example of a package-embedded board.

FIG. 12 is a cross-sectional view schematically illustrating another example of a package-embedded board.

A package-embedded board 700A2 according to another example of FIG. 12 is different from the package-embedded board 700A1 according to an example in regard that a plurality of electronic elements are disposed on the first and second insulating build-up layers 411 and 421. Therefore, a difference from the package-embedded board 700A1 according to an example will be mainly described below, and the above description of the same components as those of the package-embedded board 700A1 according to an example may also be applied to the components of the package-embedded board 700A2 according to another example.

Referring to FIG. 12, the package-embedded board 700A2 according to another example may further include a plurality of electrical connection metals 600 disposed on the first and second openings of the first and second solder resist layers 414 and 424 and connected to the exposed first and second wiring build-up layers 412 and 422, respectively. The package-embedded board 700A2 may be mounted on another printed circuit board such as a main board or an additional ball grid array board through the plurality of electrical connection metals 600. The plurality of electrical connection metals 600 may be formed of tin (Sn) or an alloy including tin (Sn), for example, a solder, but is not limited thereto. The plurality of electrical connection metals 600 may each be a land, a ball, a pin, or the like.

Further, in the package-embedded board 700A2 according to another example, a plurality of electronic elements 500A and 500B may be disposed on the first and second insulating build-up layers 411 and 421. The plurality of electronic elements 500A and 500B may be electrically connected to at least portions of the exposed first and second wiring build-up layers 412 and 422 through the electrical connection metals 600.

The electronic elements 500A and 500B may each be an active component and/or passive component. Examples of the active component may include the IC die described above in relation to the electronic component 240. Examples of the passive component may include a chip-type capacitor such as a multilayer ceramic capacitor (MLCC), and a chip-type inductor such as a power inductor (PI). If necessary, a molding material covering the electronic element 500A and 500B may be additionally disposed on each of the first and second solder resist layers 414 and 424, and the molding material may be a known epoxy molding compound (EMC), but is not limited thereto. In a case in which the electronic elements 500A and 500B are additionally disposed, the package-embedded board 700A2 may be utilized as a package module, for example, a system in package (SiP).

Other contents overlap those described above, and overlapping descriptions will be thus omitted.

Figure 13:
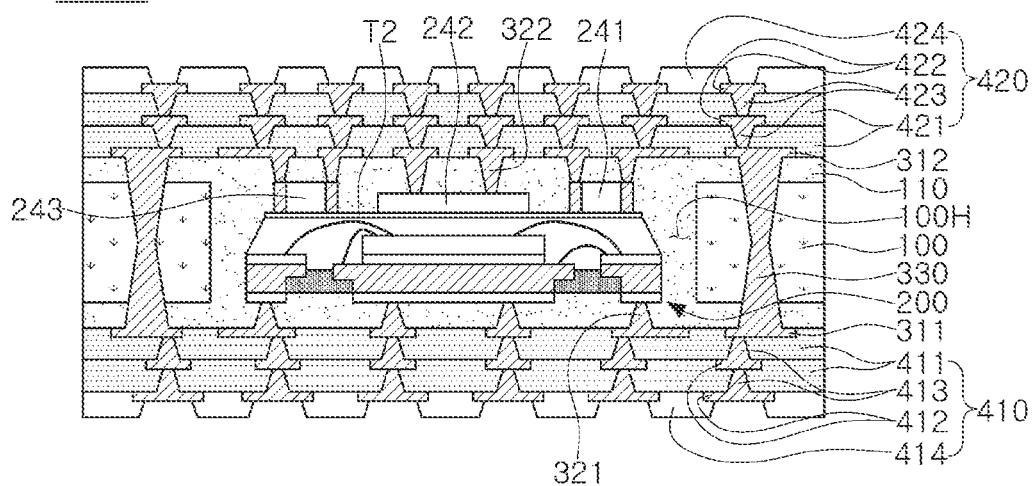
FIG. 13 is a cross-sectional view schematically illustrating another example of a package-embedded board.

FIG. 13 is a cross-sectional view schematically illustrating another example of a package-embedded board.

FIG. 13 illustrates a package-embedded board 700A3 according to another example. The package-embedded board 700A3 according to another example is different from the package-embedded board 700A1 according to an example in regard that surface-mounted elements are disposed on the package. Therefore, a difference from the package-embedded board 700A1 according to an example will be mainly described below, and the above description of the same components as those of the package-embedded board 700A1 according to an example may also be applied to the components of the package-embedded board 700A3 according to another example.

Referring to FIG. 13, a plurality of surface-mounted elements 241, 242, and 243 that are covered by the core insulating material 110 may be disposed on the package 200 of the package-embedded board 700A3 according to another example. As the plurality of surface-mounted elements 241, 242, and 243 are disposed on the package 200, the advanced and high-integrated package-embedded board 700A3 may be manufactured. Further, according to the related art, electronic elements are disposed on a plane different from that of the package 200, and thus, a space for the electronic elements are additionally required. However, in a case of the package-embedded board 700A3 according to another example, the plurality of surface-mounted elements 241, 242, and 243 are disposed on the package 200, and thus, the overall size of the package-embedded board may be reduced, which may be advantageous in thickness reduction and miniaturization.

The plurality of surface-mounted elements 241, 242, and 243 may each be an active component and/or passive component. Examples of the active component may include the IC die described above in relation to the electronic component 240. Examples of the passive component may include a chip-type capacitor such as a multilayer ceramic capacitor (MLCC), and a chip-type inductor such as a power inductor (PI).

Meanwhile, in the package-embedded board 700A3 according to another example, the plurality of surface-mounted elements 241, 242, and 243 described above may be electrically connected to the second wiring layer 312 disposed on the other surface of the core insulating material 110 through second wiring vias 322 penetrating through at least a portion of the core insulating material 110.

A plurality of second wiring vias 322 may be formed after the package 200 and the surface-mounted elements 241, 242, and 243 are embedded in the core insulating material 110. Therefore, at least a portion of the plurality of second wiring vias 322 may have a tapered shape whose width is decreased from the second wiring layer 312 toward each of the surface-mounted elements 241, 242, and 243 connected thereto.

The second wiring via 322 may be formed of a metal material such as copper (Cu), aluminum (Al), silver (Ag), tin (Sn), gold (Au), nickel (Ni), lead (Pb), titanium (Ti), or alloys thereof. The second wiring via 322 may be a via for a signal, a via for a ground, a via for power, or the like, depending on designs. The second wiring via 322 may be formed by completely filling a via hole with a metal material. Alternatively, a metal material may be formed along a wall of the via hole. The second wiring via 322 may also be formed by plating such as AP, SAP, MSAP, or TT. As a result, the second wiring via 322 may include a seed layer, an electroless plating layer, and an electroplating layer formed on the basis of the seed layer. The number of second wiring vias 322 may be plural, and each of the second wiring vias 322 may have a tapered shape, one surface of which having a width wider than that of the other surface.

The second wiring via 322 may connect at least a portion of the second wiring layer 312 to an external connection terminal of each of the plurality of surface-mounted elements 241, 242, and 243. For example, in a case in which some of the plurality of surface-mounted elements 241, 242, and 243 are MLCCs or inductors, external electrodes thereof and the second wiring vias 322 may be connected to each other, and in a case in which the plurality of surface-mounted elements 241, 242, and 243 are semiconductor chips, connection terminals disposed on surfaces thereof and the second wiring vias 322 may be connected to each other.

Each of the plurality of surface-mounted elements 241, 242, and 243 may be attached onto the molded portion 260 of the package 200 using an adhesive layer T2. However, the adhesive layer T2 may be omitted.

Other contents overlap those described above, and overlapping descriptions will be thus omitted.

FIGS. 14 through 17 are cross-sectional views schematically illustrating an example of a process for manufacturing the package-embedded board 700A3 according to another example of FIG. 13.

Figure 14:
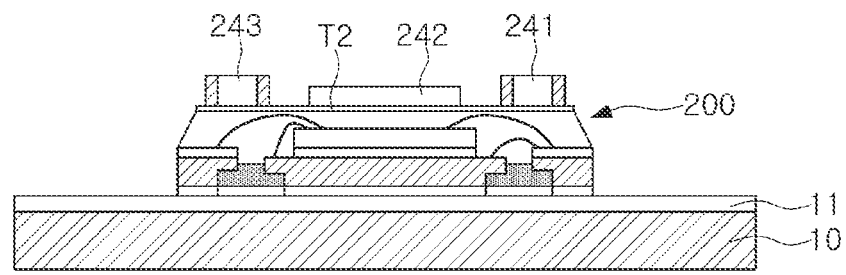
FIGS. 14 through 17 are cross-sectional views schematically illustrating an example of a process for manufacturing the package-embedded board of FIG. 13.

Referring to FIG. 14, similarly to the package-embedded board 700A1 according to an example, the package 200 may be attached onto the carrier 10. Further, the plurality of surface-mounted elements 241, 242, and 243 may be additionally attached onto the molded portion 260 of the package 200 using the adhesive layer T2.

Figure 15:
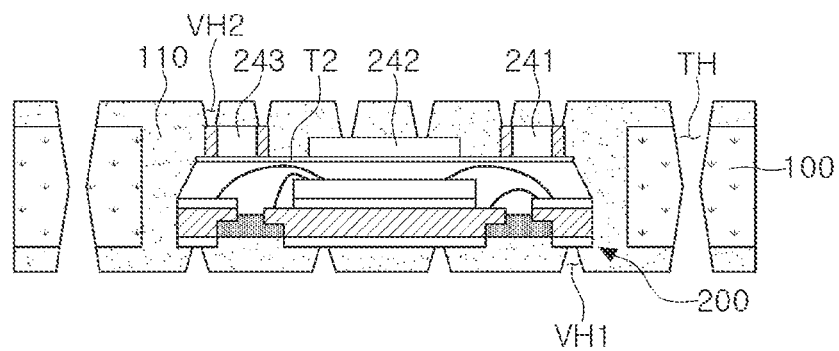

Then, referring to FIG. 15, the core layer 100 and the core insulating material 110 may be disposed similarly to the package-embedded board 700A1 according to an example, and the package 200 on which the plurality of surface mounting elements 241, 242, and 243 are mounted may be disposed in the through-hole portion 100H of the core layer 100. In this case, the core insulating material 110 may be in contact with at least a portion of outer surfaces of the plurality of surface-mounted elements 241, 242, and 243, in addition to the package 200, and may cover the package 200 and the plurality of surface-mounted elements 241, 242, and 243. If necessary, in the stacking process, heating may be additionally performed to increase fluidity of the core insulating material 110. After the stacking, the unhardened or semi-hardened materials may be hardened by heating or the like.

Further, a through via hole TH, a first wiring via hole VH1, and a second wiring via hole VH2 may be formed, the through via hole TH penetrating through at least a portion of each of the core insulating material 110 and the core layer 100, the first wiring via hole VH1 penetrating through at least a portion of the core insulating material 110 from one surface of the core insulating material 110 and exposing at least a portion of the die pad 220 or the lead 210, and the second wiring via hole VH2 penetrating through at least a portion of the core insulating material 110 from the other surface of the core insulating material 110 and exposing at least a portion of a connection portion of each of the plurality of surface-mounted elements 241, 242, and 243 to the outside.

Figure 16:
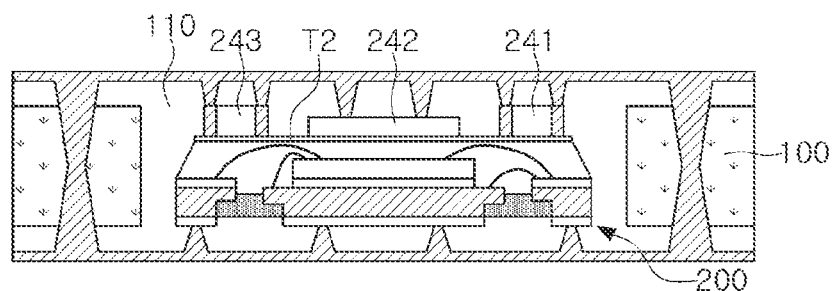
Figure 17:
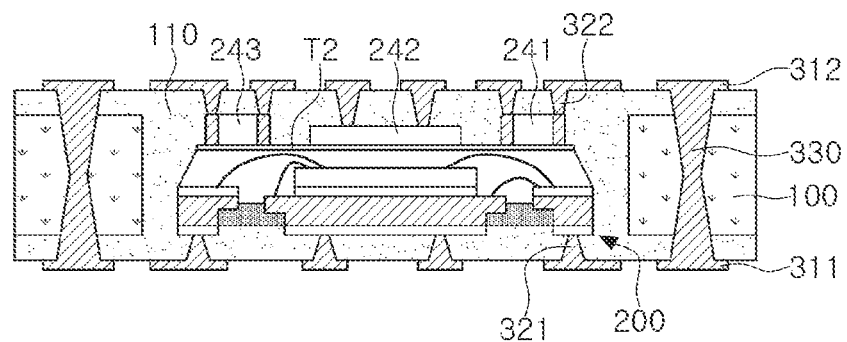

Then, referring to FIGS. 16 and 17, the through via 330, the first wiring via 321, and the second wiring via 322 may be formed by filling the through via hole TH, the first wiring via hole VH1, and the second wiring via hole VH2 through plating or by performing plating on inner walls of the through via hole TH, the first wiring via hole VH1, and the second wiring via hole VH2. Further, plating layers may be formed on one surface and the other surface of the core insulating material 110, respectively, and the first and second wiring layers 311 and 312 may be formed by patterning the plating layers, respectively.

In the package-embedded board 700A3 according to another example, as the plurality of surface-mounted elements 241, 242, and 243 disposed on the package 200 are electrically connected to the second wiring layer 312 as described above, various wiring paths may be secured, and at the same time, an overall degree of integration of the package-embedded board 700A3 may be increased, and a thickness and occupied area of the package-embedded board 700A3 may be reduced, thereby reducing the size of the board.

Other contents overlap those described above, and overlapping descriptions will be thus omitted.

Figure 18:
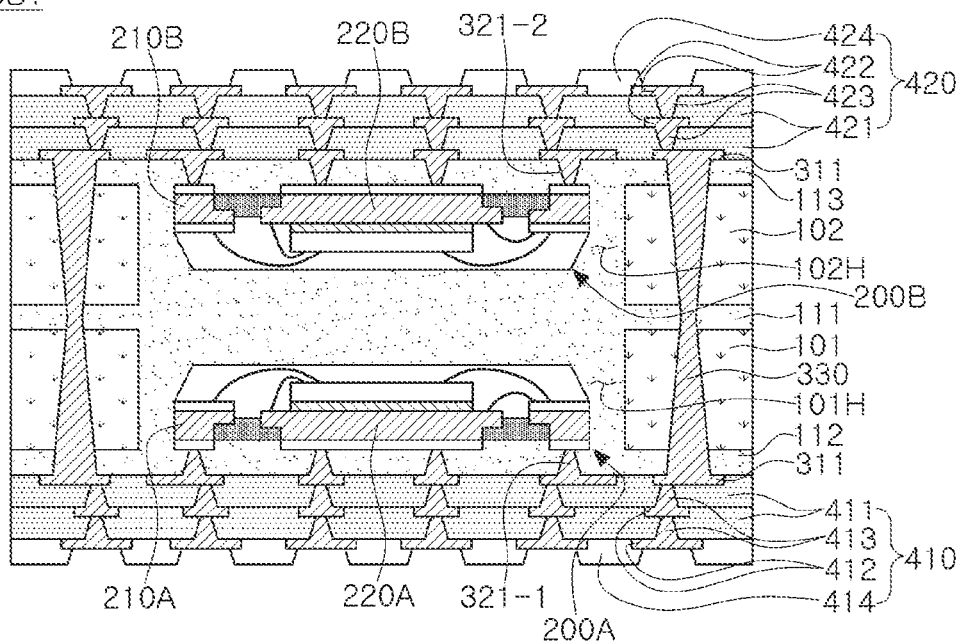
FIG. 18 is a cross-sectional view schematically illustrating another example of a package-embedded board.

FIG. 18 is a cross-sectional view schematically illustrating another example of a package-embedded board.

FIG. 18 illustrates a package-embedded board 700B1 according to another example. The package-embedded board 700B1 according to another example has a structural difference from the package-embedded board 700A1 according to an example in regard that a plurality of core layers and a plurality of packages may be disposed, and the plurality of packages are disposed so as to face each other.

Referring to FIG. 18, the package-embedded board 700B1 according to another example includes first and second core layers 101 and 102 each having first and second through-hole portions 101H and 102H, respectively, first and second packages 200A and 200B disposed in the first and second through-hole portions 101H and 102H, respectively, a first core insulating material 111 disposed between the first and second core layers 101 and 102 and filling at least portions of the first and second through-hole portions 101H and 102H, a second core insulating material 112 disposed on one surface of the first core layer 101, a third core insulating material 113 disposed on one surface of the second core layer 102, a first build-up structure 410 disposed on one surface of the second core insulating material 112, and a second build-up structure 420 disposed on one surface of the third core insulating material 113.

The package-embedded board 700B1 according to another example may include a plurality of core layers 101 and 102. As the plurality of thick core layers are disposed, the package-embedded board 700B1 according to another example may be advantageous in controlling warpage.

The package-embedded board 700B1 according to another example may include the first and second packages 200A and 200B, and the first and second packages 200A and 200B may be at least partially disposed in the first and second through-hole portions 101H and 102H, respectively. Meanwhile, the first and second packages 200A and 200B may be disposed at an upper portion and a lower portion in a thickness direction, respectively, and may be disposed so as to face each other. That is, the first and second packages 200A and 200B may be disposed so that molded portions 260A and 260B thereof face each other, and therefore, the second package 200B may be disposed so as to be vertically inverted with respect to the first package 200A. As a result, an overall degree of integration and intensity of the package-embedded board 700B1 may be increased, and an overall size of the board may be reduced.

Further, in the package-embedded board 700B1 according to another example, a first wiring layer 311 may be disposed on one surface of each of the second and third core insulating materials 112 and 113. The first wiring layer 311 may be connected to the first wiring layer 311 disposed on a different surface, or the package 200, through a through via 330 or first wiring vias 321.

Specifically, the first insulating layer 311 disposed on one surface of the second core insulating material 112 may be electrically connected to the first wiring layer 311 disposed on one surface of the third core insulating material 113 through the through via 330.

Meanwhile, the first wiring layers 311 disposed on one surfaces of the second and third core insulating materials 112 and 113 may be electrically connected to first lead 210A and second leads 210B of the first and second packages 200A and 200B, respectively, through the first wiring vias 321-1 and 321-2.

Meanwhile, the first wiring layer 311 disposed on one surface of each of the second and third core insulating materials 112 and 113 may also be electrically connected to first and second die pads 220A and 220B of the first and second packages 200A and 200B, respectively, through the first wiring vias 321-1 and 321-2.

In the package-embedded board 700B1 according to another example, as the first and second core layers 101 and 102 are disposed, the through via 330 may penetrate through both of the first and second core layers 101 and 102. Further, the through via 330 may also penetrate through at least a portion of each of the first to third core insulating materials 111, 112, and 113. The through via 330 may penetrate through both of the first and second core layers 101 and 102, and electrically connect the first wiring layer 311 disposed on one surface of the second core insulating material 112 and the first wiring layer 311 disposed on one surface of the third core insulating material 113 to each other.

In the package-embedded board 700B1 according to another example, the first wiring vias 321-1 and 321-2 may include a 1-1st wiring via 321-1 and a 1-2nd wiring via 321-2 formed in the second and third core insulating materials 112 and 113, respectively. The 1-1st wiring via 321-1 may penetrate through at least a portion of the second core insulating materials 112 and have a tapered shape whose width is decreased from one surface of the second core insulating material 112 toward the first package 200A, and the 1-2nd wiring via 321-2 may penetrate through at least a portion of the third core insulating materials 113 and have a tapered shape whose width is decreased from one surface of the third core insulating material 113 toward the second package 200B.

As a result, the 1-1st and 1-2nd wiring vias 321-1 and 321-2 may each have a tapered shape whose width is decreased from an outer portion toward an inner portion of the package-embedded board 700B1 in a stacking direction.

FIGS. 19 through 27 are cross-sectional views schematically illustrating an example of a process for manufacturing the package-embedded board of FIG. 18.

Figure 19:
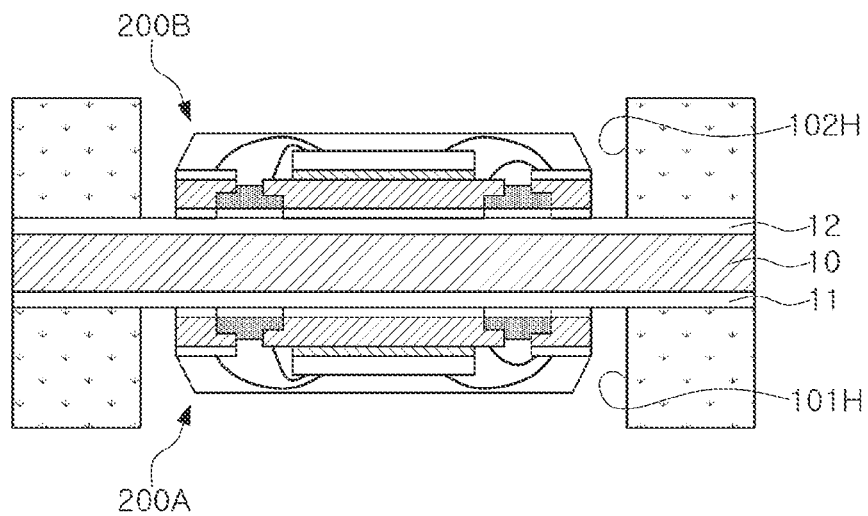
FIGS. 19 through 27 are cross-sectional views schematically illustrating an example of a process for manufacturing the package-embedded board of FIG. 18.

Referring to FIG. 19, similarly to the method for manufacturing the package-embedded board 700A1 according to an example, the first and second packages 200A and 200B may be disposed on adhesives 11 and 12 of a carrier 10, respectively. The method for manufacturing the package-embedded board 700B1 according to another example is different from the method for manufacturing the package-embedded board 700A1 according to an example in regard that the first and second packages 200A and 200B and the first and second core layers 101 and 102 having the through-hole portions 101H and 102H, respectively, are stacked on opposite surfaces of the carrier 10.

Figure 20:
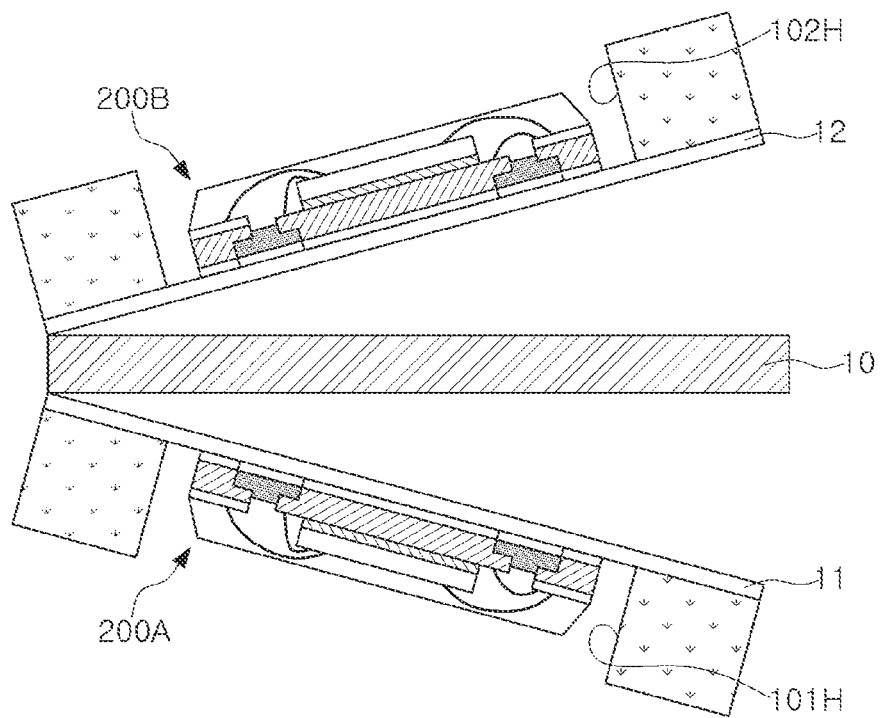
Figure 21:
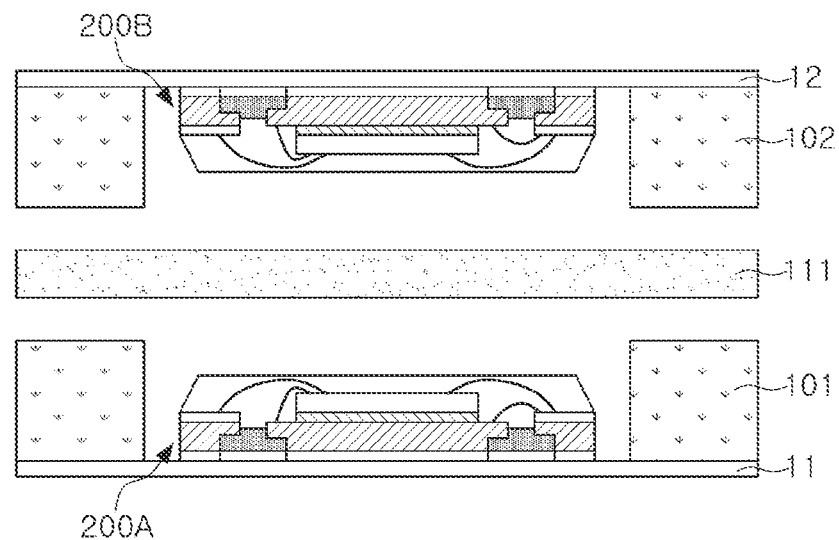

Then, as illustrated in FIG. 20, the carrier 10 is separated, and as illustrated in FIG. 21, the second core layer 102 and the second package 200B are vertically inverted in a state of being attached onto the adhesive 12, such that the second core layer 102 and the second package 200B are disposed so as to face the first core layer 101 and the first package 200A. Further, the first core insulating material 111 is disposed between the first core layer 101 and the second core layer 102.

Figure 22:
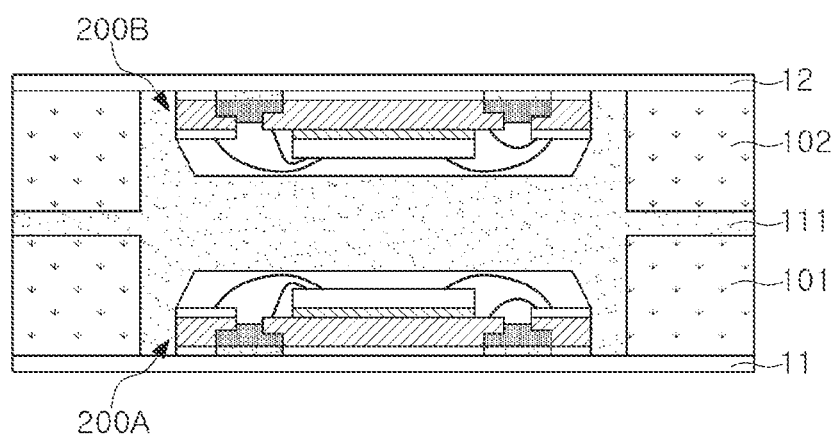
Figure 23:
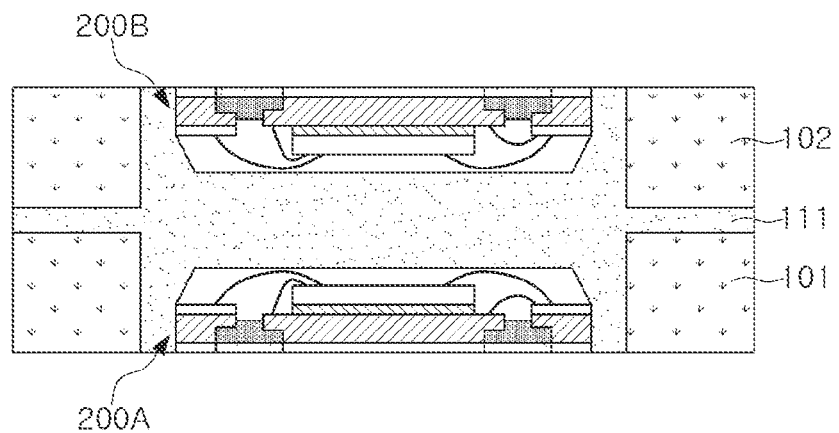

Then, as illustrated in FIGS. 22 and 23, the first and second core layers 101 and 102, and the first core insulating material 111 disposed between the first and second core layers 101 and 102 are compressed, such that the first core insulating material 111 flows into the first and second through-hole portions 101H and 102H of the first and second core layers 101 and 102. Here, the first core insulating material 111 may be in physical contact with at least a portion of each of an upper surface, a lower surface, and side surfaces of each of the first and second packages 200A and 200B while covering the first and second packages 200A and 200B.

If necessary, in the stacking process, heating may be additionally performed to increase fluidity of the first core insulating material 110. After the stacking, the unhardened or semi-hardened materials may be hardened by heating or the like. Then, the adhesives 11 and 12 may be separated.

Figure 24:
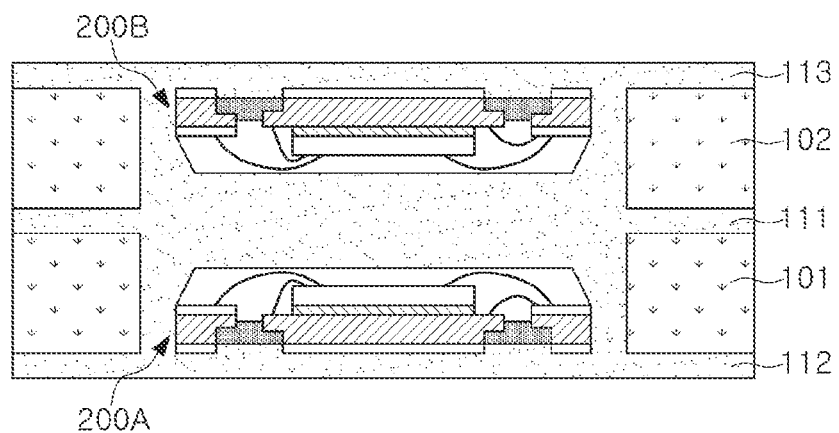

Next, as illustrated in FIG. 24, the second core insulating material 112 is disposed on the first core layer 101 and the first core insulating material 111, and the third core insulating material 113 is disposed on the second core layer 102 and the first core insulating material 111. In this case, boundaries between the first to third core insulating materials 111, 112, and 113 may be clear or unclear. The second core insulating material 112 may be disposed to cover the lead 210A and the die pad 220A of the first package 200A, and the third core insulating material 113 may be disposed to cover the lead 210B and the die pad 220B of the second package 200B.

Figure 25:
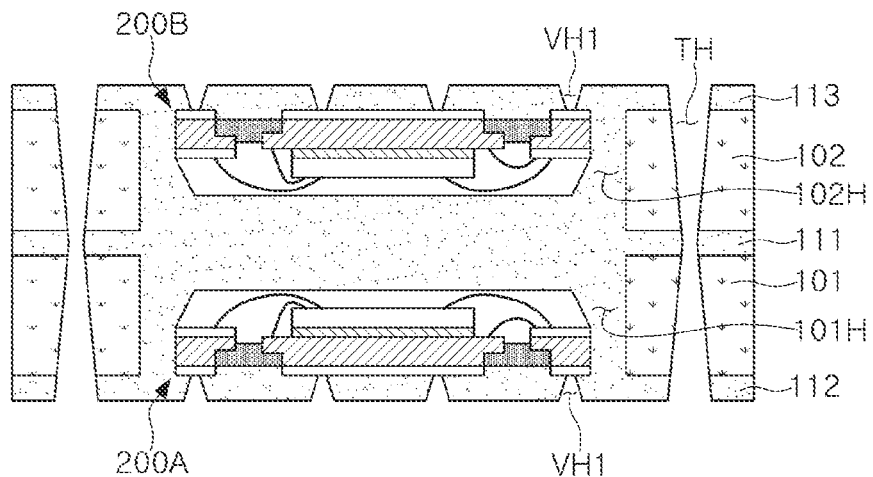

Referring to FIG. 25, a through via hole TH and a first wiring via hole VH1 may be formed, the through via hole TH penetrating through at least a portion of each of the first to third core insulating materials 111, 112, and 113, and first and second core layers 101 and 102, and the first wiring via hole VH1 penetrating through at least a portion of each of the second and third core insulating materials 112 and 113.

The through via hole TH may be formed by double-side machining and have an hourglass shape or a shape whose width is decreased and then increased from one end toward the other end.

The first wiring via hole VH1 may penetrate through at least a portion of each of the second and third core insulating materials 112 and 113, and may expose at least a portion of each of the first and second leads 210A and 210B and first and second die pads 220A and 220B to the outside.

Figure 26:
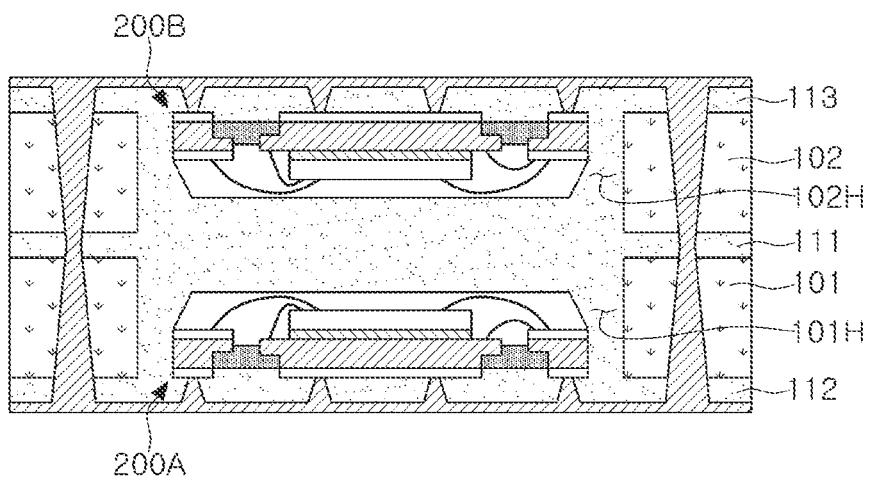
Figure 27:
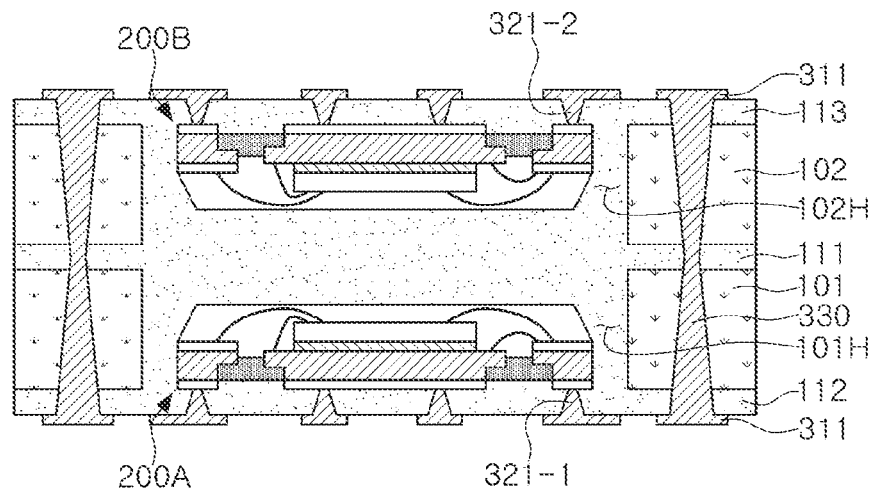

Referring to FIGS. 26 and 27, the through via 330 and the first wiring via 321-1 and 321-2 may be formed by filling the through via hole TH and the first wiring via hole VH1 through plating or by performing plating on inner walls of the through via hole TH and the first wiring via hole VH1. Further, plating layers may be formed on one surfaces of the second and third core insulating materials 112 and 113, respectively, and the first wiring layers 311 may be formed by patterning the plating layers, respectively.

The first wiring layer 311 formed on the second core insulating material 112 may be electrically connected to the first lead 210A or the first die pad 220A of the first package 200A through the first wiring via 321-1 formed in the second core insulating material 112.

The first wiring layer 311 formed on the third core insulating material 113 may be electrically connected to the second lead 210B or the second die pad 220B of the second package 200B through the first wiring via 321-2 formed in the third core insulating material 113.

Then, the first and second build-up structures 410 and 420 may be built up on the second and third core insulating materials 112 and 113, respectively, to implement the structure of the package-embedded board 700B1 according to another example of FIG. 18.

The overall thickness of the package-embedded board 700B1 according to another example may be effectively reduced by the above-described manufacturing process, thereby implementing high integration and high density. Further, since both the first and second packages 200A and 200B may be molded using the first core insulating material 111, manufacturing costs may be reduced. In addition, the package-embedded board 700B1 including both of the first and second packages 200A and 200B may be collectively manufactured, thereby realizing process simplification and an increase of yield.

Other contents overlap those described above, and overlapping descriptions will be thus omitted.

Figure 28:
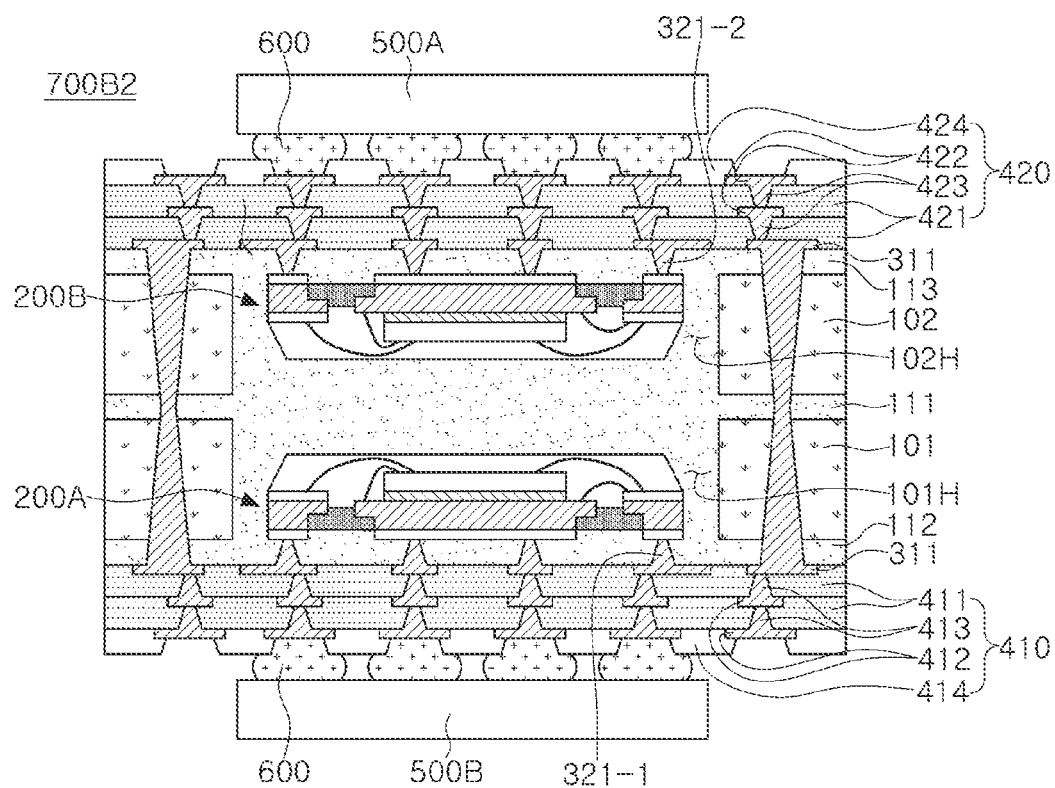
FIG. 28 is a cross-sectional view schematically illustrating another example of a package-embedded board.

FIG. 28 is a cross-sectional view schematically illustrating another example of a package-embedded board.

A package-embedded board 700B2 according to another example of FIG. 28 is different from the package-embedded board 700B1 according to another example in regard that a plurality of electronic elements are disposed on the first and second build-up structures 410 and 420. Therefore, a difference from the package-embedded board 700B1 according to another example will be mainly described below, and the above description of the same components as those of the package-embedded board 700B1 according to another example may also be applied to the components of the package-embedded board 700B2 according to another example.

Referring to FIG. 28, the package-embedded board 700B2 according to another example may further include a plurality of electrical connection metals 600 disposed on first and second openings of first and second solder resist layers 414 and 424 and connected to exposed first and second wiring build-up layers 421 and 422, respectively. The package-embedded board 700B2 may be mounted on another printed circuit board such as a main board or an additional ball grid array board through the plurality of electrical connection metals 600. The plurality of electrical connection metals 600 may be formed of tin (Sn) or an alloy including tin (Sn), for example, a solder, but is not limited thereto. The plurality of electrical connection metals 600 may each be a land, a ball, a pin, or the like.

Further, in the package-embedded board 700B2 according to another example, referring to FIG. 28, a plurality of electronic elements 500A and 500B may be disposed on the first and second build-up structures 410 and 420, respectively. The plurality of electronic elements 500A and 500B may be electrically connected to at least portions of the exposed first and second wiring build-up layers 412 and 422, respectively, through the electrical connection metals 600.

The plurality of electronic elements 500A and 500B may each be an active component and/or passive component. Examples of the active component may include the IC die described above in relation to the electronic component 240. Examples of the passive component may include a chip-type capacitor such as a multilayer ceramic capacitor (MLCC), and a chip-type inductor such as a power inductor (PI). If necessary, molding materials covering the plurality of electronic elements 500A and 500B may be additionally disposed on the first and second solder resist layers 414 and 424, respectively, and the molding material may be a known epoxy molding compound (EMC), but is not limited thereto. In a case in which the plurality of electronic elements 500A and 500B are additionally disposed, the package-embedded board 700B2 may be utilized as a package module, for example, a system in package (SiP).

Other contents overlap those described above, and overlapping descriptions will be thus omitted.

As set forth above, according to the exemplary embodiment in the present disclosure, the package-embedded board advantageous in miniaturization and thickness reduction may be provided.

In addition, the package-embedded board improving a degree of integration may be provided.

In addition, the package-embedded board improving a space utilization level of a board in a SiP package may be provided.

While exemplary embodiments have been shown and described above, it will be apparent to those skilled in the art that modifications and variations could be made without departing from the scope of the present disclosure as defined by the appended claims.

What is claimed is:

1. A package-embedded board comprising:
a core layer having a through-hole portion;
a package at least partially disposed in the through-hole portion and including a die pad comprising a metal substrate, an electronic component disposed on the die pad, and a molded portion covering the electronic component;
a core insulating material disposed in the through-hole portion and covering the core layer and the package; and
a surface-mounted component disposed on the molded portion, of which at least a portion is disposed in the through-hole portion,
wherein the molded portion is disposed on the die pad and the plurality of leads.

2. The package-embedded board of claim 1, wherein the package includes a plurality of leads spaced apart from edges of the die pad, wherein the plurality of leads comprise the metal substrate.

3. The package-embedded board of claim 2, further comprising first and second wiring layers disposed on one surface and the other surface of the core insulating material, respectively.

4. The package-embedded board of claim 3, further comprising a first wiring via penetrating through at least a portion of the core insulating material and connecting the first wiring layer and at least one of the plurality of leads to each other.

5. The package-embedded board of claim 1, wherein the core insulating material further covers the surface-mounted component.

6. The package-embedded board of claim 5, further comprising a second wiring via penetrating through at least a portion of the core insulating material and connecting the second wiring layer and the surface-mounted component to each other.

7. The package-embedded board of claim 6, further comprising a through via penetrating through at least a portion of each of the core insulating material and the core layer, and connecting the first and second wiring layers to each other.

8. The package-embedded board of claim 6, further comprising first and second build-up structures disposed on one surface and the other surface of the core insulating material, respectively, and each including a plurality of insulating build-up layers, a plurality of wiring build-up layers, and a plurality of via build-up layers.

9. The package-embedded board of claim 8, wherein at least a portion of the plurality of via build-up layers connect each of the first and second wiring layers to at least a portion of the plurality of wiring build-up layers.

10. The package-embedded board of claim 1, further comprising another surface-mounted component disposed on the molded portion, of which at least a portion is disposed in the through-hole portion.

11. A package-embedded board comprising:
a first package including a die pad, a first electronic component disposed on the die pad, a plurality of leads spaced apart from edges of the die pad and connected to the first electronic component, and a first molded portion covering the first electronic component and the plurality of leads, the first electronic component and the plurality of leads are connected by conductive wires;
an insulating material covering the first package;
first and second wiring layers respectively disposed on opposing surfaces of the insulating material; and
first wiring vias disposed in the insulating material and connecting the first wiring layer to the plurality of leads.

12. The package-embedded board of claim 11, further comprising another wiring via disposed in the insulating material to connect the first wiring layer to the die pad.

13. The package-embedded board of claim 11, further comprising a surface-mounted component disposed on the first molded portion and covered by the insulating material.

14. The package-embedded board of claim 13, further comprising a second wiring via disposed in the insulating material and connecting the second wiring layer to the surface-mounted component.

15. The package-embedded board of claim 14, wherein the first wiring vias having a tapered shape opposite to the second wiring via, with respect to the first package or the surface-mounted component.

16. The package-embedded board of claim 13, further comprising an adhesive layer connecting the surface-mounted component to the first molded portion.

17. The package-embedded board of claim 11, further comprising a through via penetrating through the insulating material and connecting the first and second wiring layers to each other.

18. The package-embedded board of claim 11, further comprising first and second build-up structures disposed on one surface and the other surface of the insulating material, respectively, and each including a plurality of insulating build-up layers, a plurality of wiring build-up layers, and a plurality of via build-up layers.

19. The package-embedded board of claim 11, further comprising:
a second package including a second electronic component and a second molded portion covering the second electronic component; and
second wiring vias disposed in the insulating material to connect the second wiring layer to the second package,
wherein the insulating material covering the second package, and
the second package is disposed between the first wiring layer and the second wiring layer.

20. The package-embedded board of claim 19, wherein the first wiring vias having a tapered shape opposite to the second wiring vias, with respect to the first package or the second package.

* * * * *